United States Patent
Orsak, Jr.

(10) Patent No.: US 11,955,795 B2
(45) Date of Patent: Apr. 9, 2024

(54) OUTLETS, SURGE PROTECTOR, AND POWER CORDS STORAGE COMPARTMENT

(71) Applicant: Edward Gerald Orsak, Jr., Aiea, HI (US)

(72) Inventor: Edward Gerald Orsak, Jr., Aiea, HI (US)

(*) Notice: Subject to any disclaimer, the term of this patent is extended or adjusted under 35 U.S.C. 154(b) by 324 days.

(21) Appl. No.: 17/534,271

(22) Filed: Nov. 23, 2021

(65) Prior Publication Data

US 2022/0181872 A1  Jun. 9, 2022

Related U.S. Application Data

(60) Provisional application No. 63/123,421, filed on Dec. 9, 2020.

(51) Int. Cl.
| | |
|---|---|
| H05K 5/02 | (2006.01) |
| H01R 13/66 | (2006.01) |
| H02H 9/04 | (2006.01) |
| H05K 5/03 | (2006.01) |

(52) U.S. Cl.
CPC ......... *H02H 9/044* (2013.01); *H01R 13/6666* (2013.01); *H05K 5/0221* (2013.01); *H05K 5/0226* (2013.01); *H05K 5/0247* (2013.01); *H05K 5/03* (2013.01)

(58) Field of Classification Search
CPC ............. H01R 13/6666; H05K 5/0221; H05K 5/0226; H05K 5/0247; H05K 5/03
See application file for complete search history.

(56) References Cited

U.S. PATENT DOCUMENTS

| | | | |
|---|---|---|---|
| 4,613,728 A | 9/1986 | Lathrop | |
| 5,773,757 A | 6/1998 | Kenney et al. | |
| 7,094,969 B1* | 8/2006 | In ............................. | H02G 3/14 |
| | | | 174/67 |
| 7,595,446 B2 | 9/2009 | Turcovsky et al. | |
| 8,242,364 B1* | 8/2012 | Shotey ..................... | H02G 3/14 |
| | | | 174/67 |
| 8,445,780 B1 | 5/2013 | Robins | |
| 9,887,528 B2* | 2/2018 | Melistas ................. | H02G 3/14 |
| 2006/0264094 A1 | 11/2006 | Young | |
| 2009/0001082 A1* | 1/2009 | Goldenne .............. | H02G 3/121 |
| | | | 220/477 |
| 2010/0126749 A1 | 5/2010 | Dumas | |
| 2021/0151968 A1* | 5/2021 | Oliver ................. | H01R 13/447 |

* cited by examiner

*Primary Examiner* — Sherman Ng
(74) *Attorney, Agent, or Firm* — Boudwin Intellectual Property Law, LLC; Daniel Boudwin

(57) ABSTRACT

A storage compartment is provided. The device includes a housing unit with a door. The housing unit is designed to be concealed within a wall. The housing unit is secured to the wall by a plurality of fasteners. The door is pivotally connected to the housing unit via a plurality of hinges. The door provides access to an interior volume of the housing unit. The door includes more than one spring-loaded latch that secures the door to the housing unit. A plurality of electrical outlets is disposed on the interior walls of the housing unit. A recessed area of the housing unit provides a storage area for electrical cords, surge protectors, and other items. The door includes an aperture that allows for electrical cords within the storage area to be accessed when the door is closed.

10 Claims, 5 Drawing Sheets

OUTLETS, SURGE PROTECTOR, AND POWER CORDS STORAGE COMPARTMENT

CROSS REFERENCE TO RELATED APPLICATIONS

This application claims the benefit of U.S. Provisional Application No. 63/123,421 filed on Dec. 9, 2020. The above identified patent application is herein incorporated by reference in its entirety to provide continuity of disclosure.

BACKGROUND OF THE INVENTION

The present invention relates to a storage compartment. More specifically, the present invention provides a storage compartment that is embedded into a wall and contains a door that provides a user with access to the interior volume.

As toddlers and small children begin to crawl and walk on their own, they often become highly curious. This curiosity may lead to toddlers and small children playing with electrical plugs and electrical outlets. Unaware of the potential danger it may cause, most times small children will attempt to pull on a power cord or insert their finger or an object into an electrical outlet. To prevent toddlers and small children from causing serious injury to themselves, most parents and guardians take safety precautions that eliminate a child's ability to insert any object into the electrical outlets. However, depending on their age and development a toddler or small child may circumvent those preventative methods. For example, a small child may be able to detach a safety device from the electrical outlet causing the electrical outlet to be exposed and leaving the child susceptible to a potential injury. An alternative method that cannot be circumvented by the child will improve the parents and guardians' efforts to prevent children from being injured by playing with electrical plugs and electrical outlets.

Protective methods that prevent children from getting injured from electrical outlets may be inconvenient to other members of the household that are not a toddler or small child. Current methods used to prevent children from playing with an electrical outlet include inserting a guard into the electrical outlet. The guards are made from a material that cannot conduct electricity but are easily inserted and removed from the electrical outlet. Other types of safety guards will encase the entire electrical outlet. When a guard is inserted into an electrical outlet or an electrical outlet is completely encapsulated by a casing, the electrical outlet cannot be used by anyone. To use the specific electrical outlet, individuals that are not a small child have to either remove the protective device from the electrical outlet, or to find another electrical outlet that they can use. If removed, the other members of the household could potentially forget to reinsert the guard after their use of the electrical outlet. Forgetting to secure the protective device back into the electrical outlet will leave it exposed for a small child to potentially be harmed.

Additionally, restricting an abundance of electrical outlets with protective devices, to prevent access to a toddler or small child, limit the electrical outlets available for use. With limited usable electrical outlets, there is a chance that the available electrical outlets may become overused or provide power to too many devices. An overuse of an electrical outlet can lead to power outages or power surges. Moreover, when there are an abundance of power cords or outlet adaptors inserted into a single electrical outlet, the power cords can be tangled and even damaged. Providing a means to protect against injuries to small children, but not rendering an electrical outlet completely inoperative, will prevent overuse of non-protected electrical outlets. Also, a device that can organize the power cords that are connect will limit tangling and subsequently prevent damage to the power cords.

Therefore, there is a defined need amongst the known prior art references for a storage compartment that houses plugs and surge protectors in an embedded housing unit that allows a user to prevent children from accessing the power outlets.

SUMMARY OF THE INVENTION

In view of the foregoing disadvantages inherent in the types of storage compartments now present in the known art, the present invention provides a new storage compartment which includes a concealed electrical outlet system having a recessed rear cord storage area and a spring loaded access door with a cord opening.

It is therefore an object of the present invention to provide a concealed electrical outlet system having a recessed rear cord storage area. Embedding the storage compartment into a wall, so that the front of the storage compartment is on the same plane as the surface of the wall, will prohibit the storage compartment from occupying space within a room or hallway. Occupying little to no space within a room will allow for the homeowners or occupants from having to be restricted by a non-concealed storage compartment. Additionally, the concealability of the storage compartment will prevent small children from becoming entices by the storage compartment and the contents therein. If the small children do not become enthralled with the storage compartment, they will be less likely to attempt to access the interior volume. Moreover, the recessed rear cord storage allows for an individual to insert larger adapters into the storage compartment, such as a surge protector. Allowing space for a surge protector or any other adapter will allow a user to connect more outlet plugs to the power supply. Allowing for more devices to receive power from the outlets within the storage compartment will encourage more use of the storage compartment and reduce the use of other power outlets—other power outlets that might be enticing for small children. Specifically, an individual will not experience the same inhibiting that a small child will due to the use of the storage compartment and will not leave the individual having to remember to reinsert a safety device following their use of the electrical outlet.

Another aspect of the present invention is to provide a spring loaded access door with a cord opening. As the user places all of their cords and outlet plugs within the interior volume they must have a means to access the interior volume. However, the user's ability to access the interior volume must also maintain the protective purpose of the storage compartment to prevent small children from accessing the cords and outlet plugs. Thus, a spring loaded access door will enable an individual to access the interior volume but prevent a child from doing the same. Moreover, the spring loaded latches will be simple for an individual to disengage to gain access, yet difficult for a small child. Disengaging such latches will require fine motor skills that small children tend to lack at their stage of development. At the same time, providing an opening on the access door will allow for the user to have a cord connected to an electrical outlet within the storage compartment, but still provide power to the device outside the storage compartment without a small child being able to disengage the cord from the power outlet.

BRIEF DESCRIPTIONS OF THE DRAWINGS

Although the characteristic features of this invention will be particularly pointed out in the claims, the invention itself and manner in which it may be made and used may be better understood after a review of the following description, taken in connection with the accompanying drawings wherein like numeral annotations are provided throughout.

DETAILED DESCRIPTION OF THE INVENTION

Figure 1:
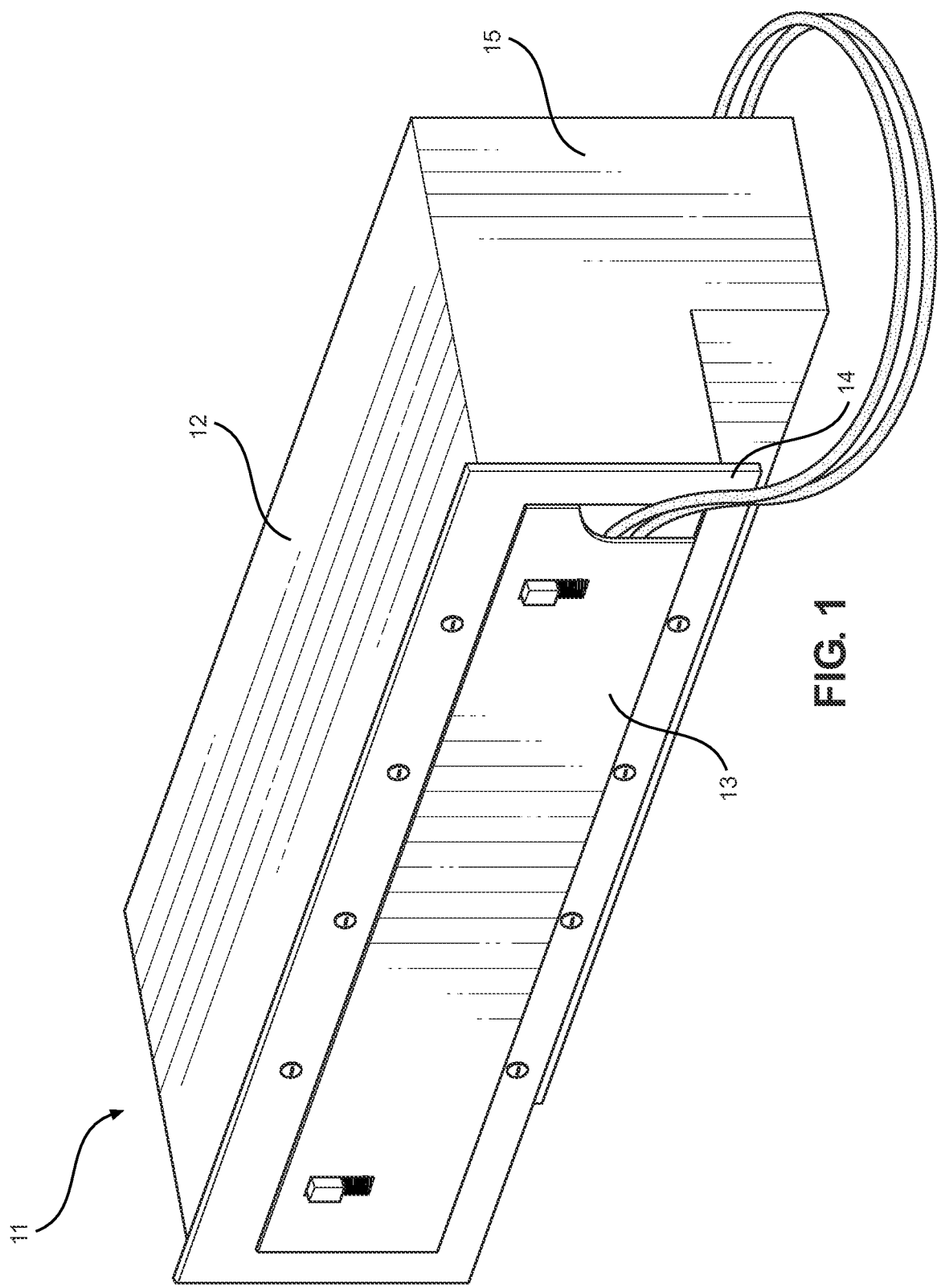
FIG. 1 shows a perspective view of an embodiment of the storage compartment.

Reference is made herein to the attached drawings. Like reference numerals are used throughout the drawings to depict like or similar elements of the storage compartment. The figures are intended for representative purposes only and should not be limiting in any respect.

FIG. 1 shows a perspective view of an embodiment of a storage compartment. The storage compartment 11 comprises a housing unit 12. The housing unit 12 includes a front face 13. The front face 13 comprise a plurality of perimeter edges 14. The plurality of perimeter edges 14 extend beyond the housing unit 12. The plurality of perimeter edges 14 allow the storage compartment 11 to sit flush against a surface of a wall. The housing unit 12 further includes a body 15. In the shown embodiment, the body 15 includes a recessed area. The recessed area of the body 15 extends outward and downward with respect to the front face 13.

Figure 2:
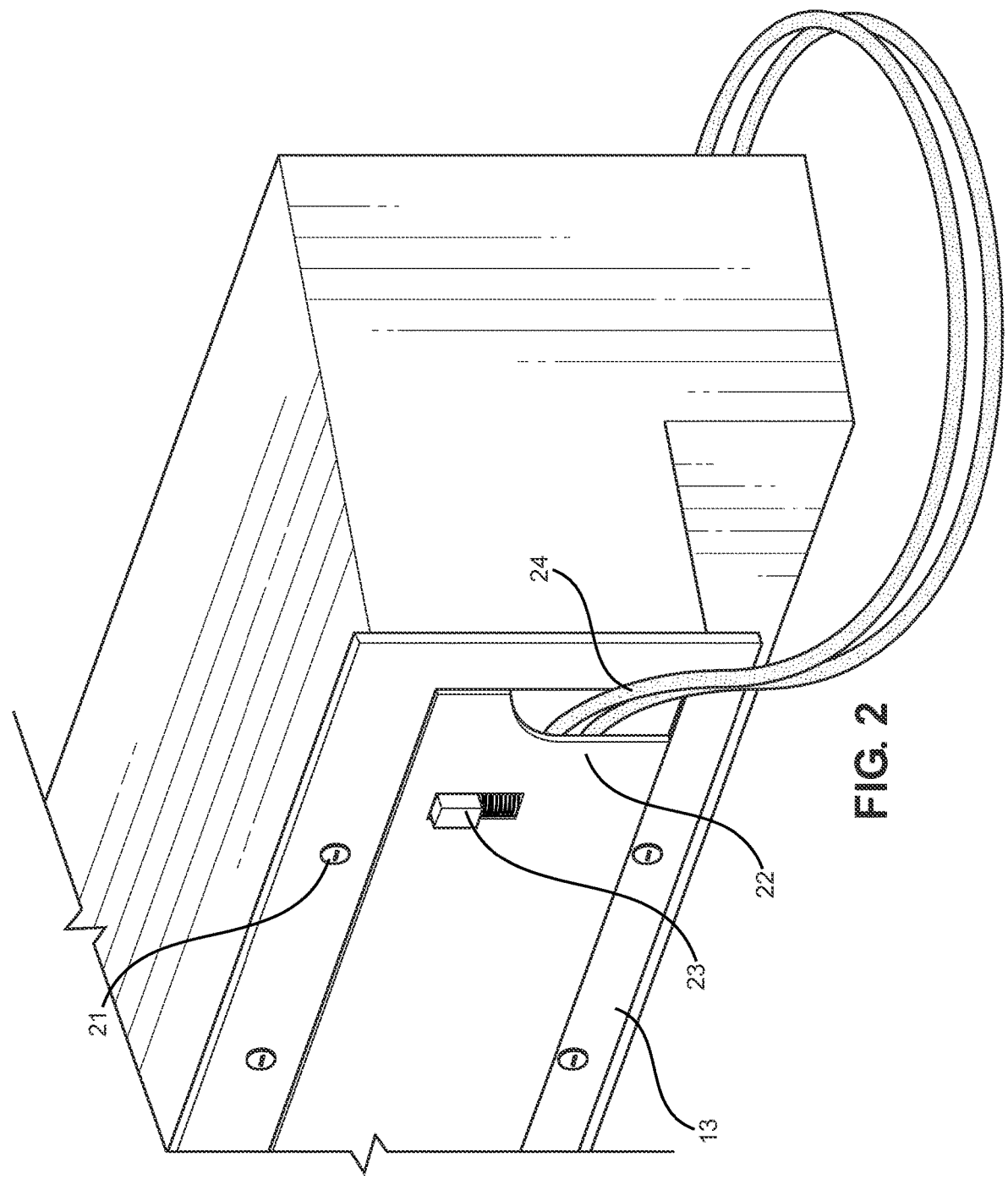
FIG. 2 shows a close-up view of an embodiment of the storage compartment.

FIG. 2 shows a close-up view of an embodiment of a storage compartment. The storage compartment comprises an interior volume. A user can access the interior volume via a door 22. The door 22 is operably connected to the front face 13. In one embodiment, the door 22 is pivotally coupled with the front face 13 via a plurality of hinges or similar mechanism. The door 22 further includes more than one spring-loaded latch 23. The more than one spring-loaded latch 23 secures the door 22 to the front face 13. Each spring-loaded latch of the more than one spring-loaded latch 23 includes a knob. A user can apply a downward force upon the know to lower a rear latch and release the door 22. To open the door 22, a user must engage all spring loaded latches of the more than one spring-loaded latch 23 at the same time. An aperture 24 is disposed on the door 22. The aperture 24 allows for wires and cords to pass through the door 22 from the interior volume to the external space outside the storage compartment. This allows users to connect their electronic devices to a power outlet disposed on the interior wall of the housing unit 12.

A plurality of fasteners 21 is disposed on the plurality of perimeter edges the front face 13. The plurality of fasteners 21 secures the housing unit 12 to the surface of a wall. The plurality of fasteners 21 permit the front face 13 to sit flush against the surface of the wall and the housing unit to be secured behind the surface of the wall. In one embodiment, the plurality of fasteners 21 are screws. In one embodiment, the plurality of fasteners 21 are bolts. Other embodiments may include other types of fasteners 21.

Figure 3A:
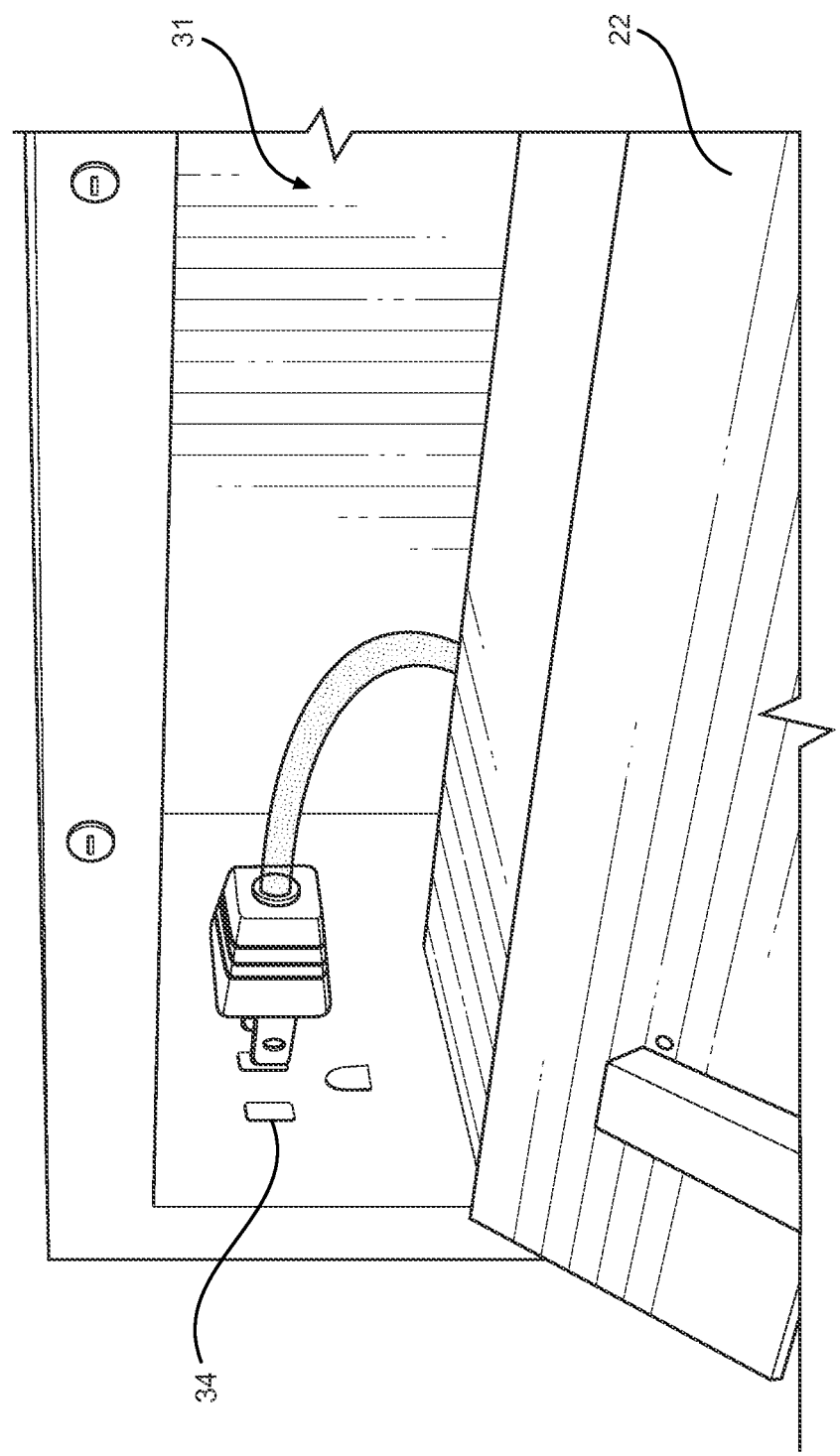
FIG. 3A shows an internal view of an embodiment of the storage compartment.

FIG. 3A shows an internal view of an embodiment of a storage compartment. When a user wants to access the interior volume 31 of the storage compartment, they can disengage the door 22 from the front face of the housing unit. The door 22 will open about the plurality of hinges. A plurality of interior walls is exposed when the user has access to the interior volume 31. A plurality of power outlets 34 is disposed on an interior wall of the housing unit. Users may selectively engage plugs and surge protectors with the plurality of power outlets 34.

Figure 3B:
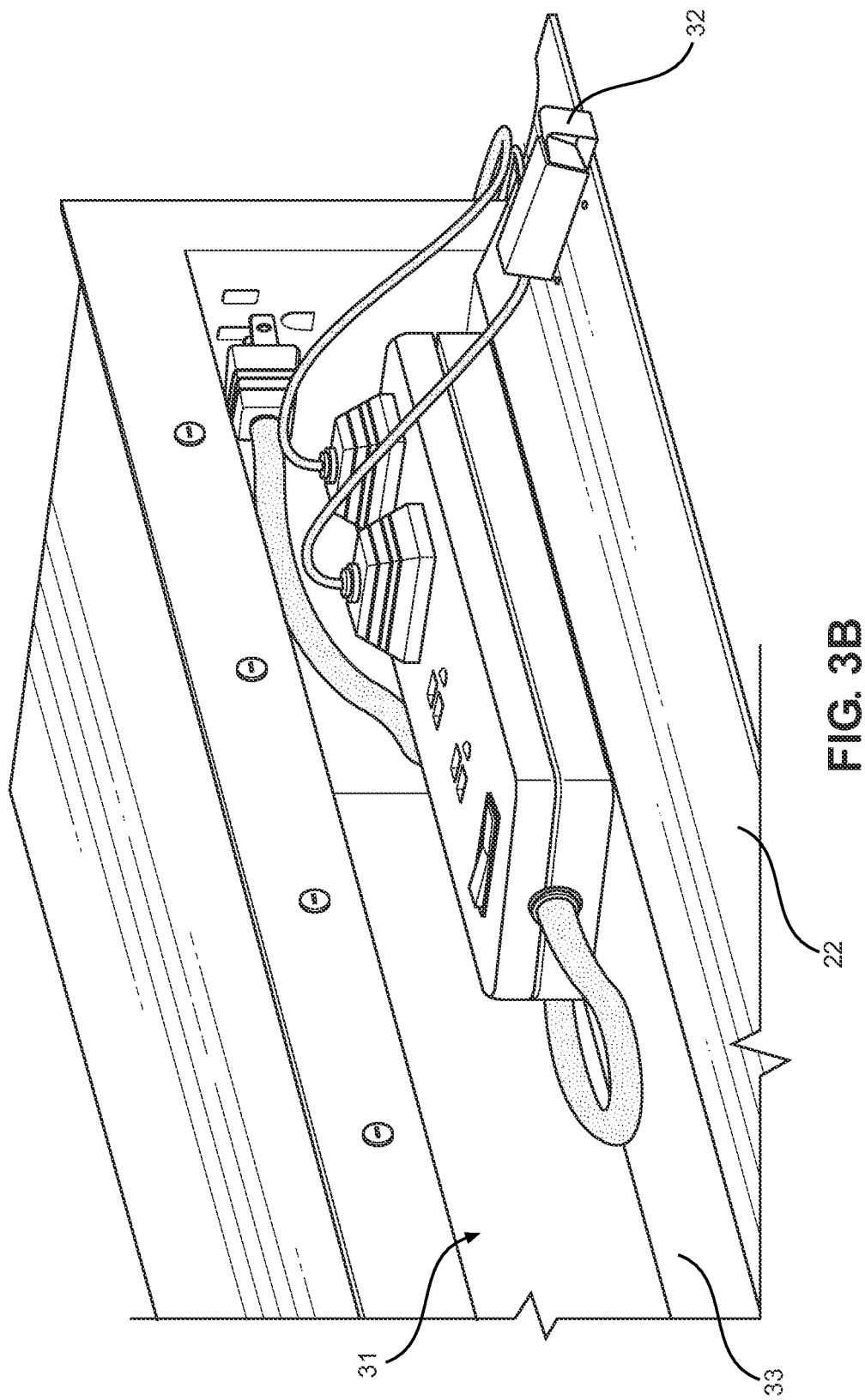
FIG. 3B shows an internal view of an embodiment of the storage compartment.

FIG. 3B shows an internal view of an embodiment of the storage compartment. The door 22 may be selectively disengage with the front face by engaging all spring loaded latches of the more than one spring-loaded latch at the same time. Prior to disengaging the door 22, a rear latch 32 extends upward from the door 22 being the front face. When all spring loaded latches of the more than one spring-loaded latch are engaged at the same time, the rear latch 32 will release from the front face and allow the door 22 to open about the plurality of hinges.

When the door 22 is disengaged from the front face, the interior volume 31 is accessible. The interior volume 31 further includes an interior surface 33 and a lower surface. The lower surface is located in the interior volume 31 where the body of the storage compartment extends downward with respect to the front face. The lower surface provides additional storage space for the items placed within the interior volume 31. Additionally, items maybe placed upon the interior surface 33. For example, a surge protector that is plugged into one power outlet of the plurality of power outlets disposed on interior wall and may rest upon the interior surface 33. The surge protector placed upon the interior surface 33 or on the lower surface provides additional power outlets for additional plugs and chargers to be connected.

Figure 4:
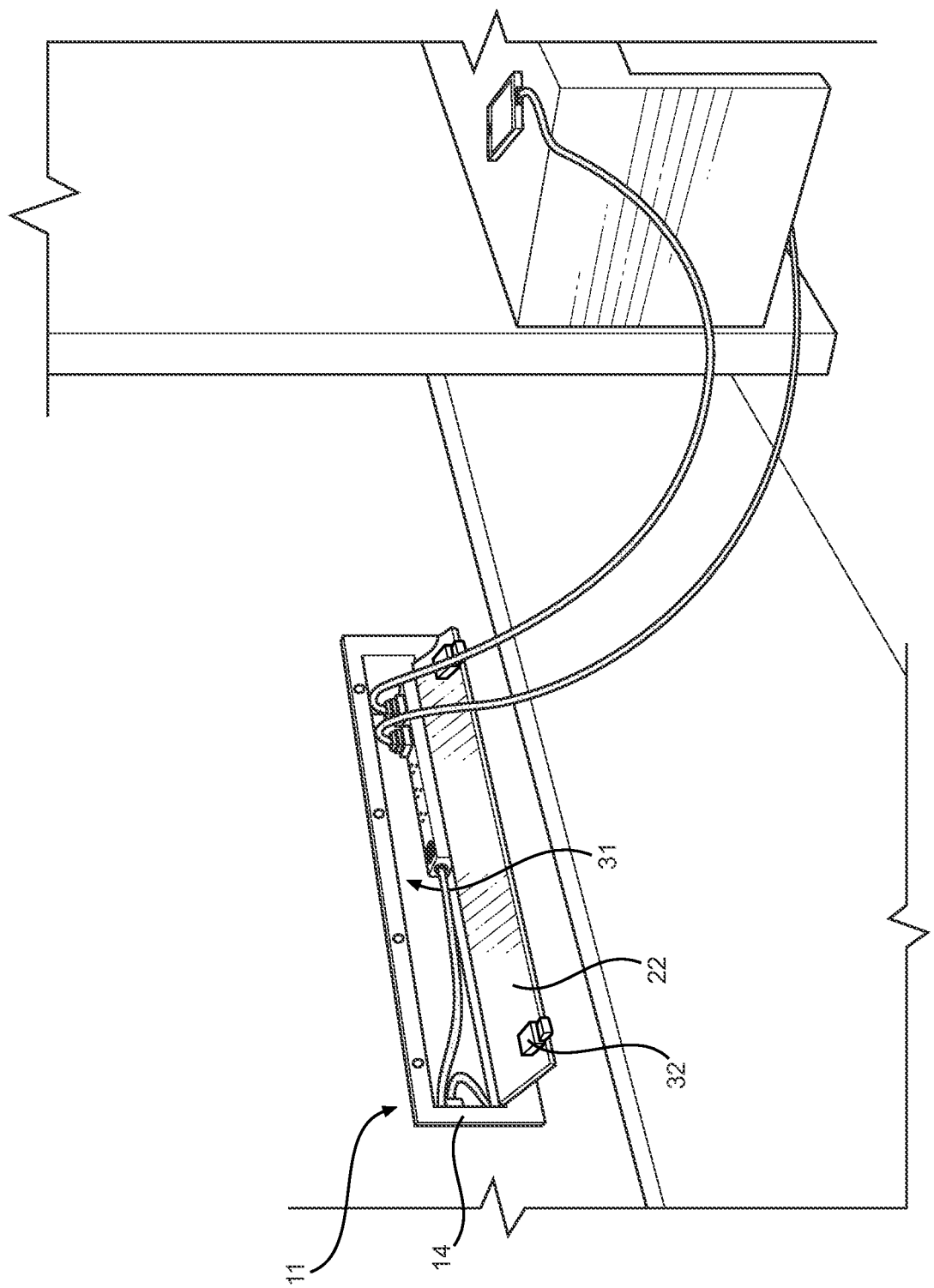
FIG. 4 shows a perspective view of an embodiment of the storage compartment in use.

FIG. 4 shows a perspective view of an embodiment of the storage compartment in use. In use, the storage compartment 11 is placed within the wall. The plurality of perimeter edges 14 will sit flush against the wall. The storage compartment 11 will be secured to the wall by the plurality of fasteners. When the storage compartment 11 is secured to the wall, a user may engage all spring loaded latches of the more than one spring-loaded latch at the same time to release the door 22 from the front face of the housing unit 12. When the engaging all spring loaded latches of the more than one spring-loaded latch, each rear latch 32 to the engaged spring-loaded latches will lower allowing the user to access the internal volume 31. When lowered, the rear latch 32 disengages with the front face of the housing unit 12 and the door 22 will pivot to an open position.

When the door 22 is opened, the interior volume 31 is accessible. The user may then connect plugs and surge protectors to the plurality of power outlets. While engaged with the plurality of power outlets, power will be supplied to the plugs and surge protectors in order to power the desired electronic device. While the plugs and surge protectors are connected to the plurality of power outlets, the user may close the door 22. When closed, the rear latch 32 will engage with the front face of the housing unit 12. The user can thread the plugs through the aperture disposed on the door 22. The aperture will allow a user to utilize the plurality of power outlets without leaving the plugs and surge protectors protected and out of reach of small children.

It is therefore submitted that the instant invention has been shown and described in what is considered to be the most practical and preferred embodiments. It is recognized, however, that departures may be made within the scope of the invention and that obvious modifications will occur to a person skilled in the art. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A storage compartment, comprising: a housing unit; wherein the housing unit includes a front face and an interior volume; the front face includes a plurality of perimeter edges; whereby the plurality of perimeter edges extends outwardly from the housing unit; a door is operably connected to the front face; more than one spring loaded latch secures the door to the front face, whereby the door is released from the front face of the housing unit when all spring loaded latches of the more than one spring loaded latch are selectively engaged at the same time; an aperture disposed on the door; a plurality of power outlets is disposed on an interior wall of the housing unit.

2. The storage compartment of claim 1, wherein the plurality of perimeter edges comprises a plurality of fasteners.

3. The storage compartment of claim 2, whereby a plurality of fasteners secures the housing unit to a surface of a wall.

4. The storage compartment of claim 1, wherein each spring loaded latch of the more than one spring loaded latch includes a knob.

5. The storage compartment of claim 1, wherein the door is pivotally attached to the front face of the housing unit via a plurality of hinges.

6. The storage compartment of claim 1, wherein the door provides access to the interior volume.

7. The storage compartment of claim 1, wherein the aperture permits a plurality of cords and wires to be placed therethrough.

8. The storage compartment of claim 1, wherein the housing unit includes a recessed area.

9. The storage compartment of claim 8, wherein the recessed area extends outward and downward from the front face.

10. The storage compartment of claim 1, wherein the plurality of perimeter edges is flushed against a surface of a wall when the housing unit is concealed behind the wall.

\* \* \* \* \*